United States Patent [19]

Nakada

[11] Patent Number: 5,124,947
[45] Date of Patent: Jun. 23, 1992

[54] SEMICONDUCTOR MEMORY DEVICE HAVING INPUT/OUTPUT DATA SIGNAL LINES PROPAGATING DATA BIT AT HIGH-SPEED REGARDLESS OF FLUCTUATION IN POWER VOLTAGE LEVEL

[75] Inventor: Kazuhiro Nakada, Tokyo, Japan
[73] Assignee: NEC Corporation, Tokyo, Japan
[21] Appl. No.: 615,738
[22] Filed: Nov. 19, 1990

[30] Foreign Application Priority Data

Nov. 17, 1989 [JP] Japan .................... 1-299320

[51] Int. Cl.⁵ .......................................... G11C 11/40
[52] U.S. Cl. .................... 365/190; 365/226; 365/189.05; 365/210
[58] Field of Search .............. 365/190, 226, 189.01, 365/189.05, 230.01, 210

[56] References Cited

U.S. PATENT DOCUMENTS 4,982,364  1/1991  Iwahashi ........................ 365/210

Primary Examiner—Terrell W. Fears
Attorney, Agent, or Firm—Sughrue, Mion, Zinn, Macpeak & Seas

[57] ABSTRACT

A semiconductor memory device comprises memory cells arranged in matrix, a plurality of bit line pairs respectively coupled to the columns of the memory cells, a plurality of word lines respectively coupled to the rows of the memory cells and selectively activating the memory cells for porducing small differences in voltage level on the plurality of bit line pairs, respectively, a plurality of sense amplifier circuits respectively coupled to the plurality of bit line pairs and selectively coupling component bit lines of the bit lines pairs to first and second voltage sources depending upon the small differences, first and second data signal lines, a column selector circuit coupling the first and second data signal lines with one of the plurality of bit line pairs, and a pull-up circuit coupled between the first voltage source and the first and second data signal lines for allowing voltage levels on the first and second data signal lines to vary within a predetermined voltage range, wherein a small current path is coupled between the first and second data signal lines and causes the voltage level on one of the first and second data signal lines to follow the other data signal line upon fluctuation at the first voltage source.

9 Claims, 7 Drawing Sheets

5,124,947

SEMICONDUCTOR MEMORY DEVICE HAVING INPUT/OUTPUT DATA SIGNAL LINES PROPAGATING DATA BIT AT HIGH-SPEED REGARDLESS OF FLUCTUATION IN POWER VOLTAGE LEVEL

FIELD OF THE INVENTION

This invention relates to a semiconductor memory device and, more particularly, to input/output data signal lines propagating a data bit at high speed regardless of fluctuation in power voltage level.

DESCRIPTION OF THE RELATED ART

A typical example of the semiconductor memory device is illustrated in FIG. 1 of the drawings. The semiconductor memory device is of the random access memory device and comprises a memory cell array 1 having a plurality of memory cells 1a and 1b coupled between a plurality of bit lines 2a and 2b and a voltage supply line VL, a combined circuit 3 of a precharging circuit and an equalization circuit provided for the bit lines 2a and 2b, a sense amplifier circuit 4 coupled to the bit lines 2a and 2b, a column selector circuit 5 coupled between the bit lines 2a and 2b and a pair of input/output data signal lines 6a and 6b, a combined circuit 7 of a precharging circuit and an equalization circuit provided for the input/output data signal lines 6a and 6b, a pull-up circuit 7 associated with the input/output data signal lines 6a and 6b, and a data amplifier circuit 8 coupled to the input/output data signal lines 6a and 6b. Each of the memory cells 1a and 1b is implemented by a series combination of a witching transistor Q1 and a storage capacitor C1 which is coupled between one of the bit lines 2a and 2b and a voltage line. A data bit is stored in each of the memory cells 1a and 1b in the form of electric charges, and the storage capacitor C1 accumulates the electric charges. A plurality of word lines W1 and W2 are provided in association with the memory cell array 1, and the switching transistors Q1 are selectively gated by the word lines W1 and W2 on the basis of row address bits. The sense amplifier circuit 4 is implemented by two series combinations of p-channel type field effect transistors Q2 and Q3 and n-channel type field effect transistors Q4 and Q5, and the two series combinations are coupled in parallel between two activation signal lines SAP and SANB. Though not shown in FIG. 1, a plurality of bit line pairs each associated with a sense amplifier circuit are respectively coupled to n-channel type filed effect transistors incorporated in the column selector circuit 5, and a control signal YSW allows a couple of n-channel type field effect transistors Q6 and Q7 to turn. The combined circuit 7 comprises a series combination of p-channel type field effect transistors Q8 and Q9 coupled between the input/output data signal lines 6a and 6b, and a p-channel type field effect transistor Q10 coupled in parallel to the series combination of the p-channel type field effect transistors Q8 and Q9, and the p-channel type field effect transistors Q8 to Q10 are concurrently gated by a precharging signal PI0 so as to precharge and equalize the input/output data signal lines 6a and 6b at a precharging voltage level VCVT. The pull-up circuit 7 has two n-channel type field effect transistors Q11 and Q12 coupled between a source of positive voltage level Vcc and the input/output data signal lines 6a and 6b, respectively.

Description is made on the circuit behavior of the semiconductor memory device with reference to FIGS. 2A to 2C of the drawings on the assumption that the memory cell 1a with a data bit of logic "1" level is accessed. The bit lines 2a and 2b are firstly precharged to a precharging level VM and are well balanced with each other by the function of the combined circuit 3. The control signal PIO remains in the ground voltage level, and the input/output data signal lines 6a and 6b are equalized at the precharging voltage level VCVT (see FIG. 2C).

The word line W1 is selected on the basis of the row address bits, and the word line W1 goes up at time t1, and the word line W1 exceeds the positive voltage level Vcc. Then, the switching transistor Q1 fully turns on, and the storage capacitor C1 is coupled through the switching transistor Q1 to the bit line 2a. The electric charges accumulated in the storage capacitor C1 are slightly discharged charged to the bit line 2a, and, for this reason, the storage capacitor C1 is decayed in voltage level at time t2 as shown in FIG. 2A. While the storage capacitor C1 is discharging the electric charges, the bit line 2a slightly goes up as shown in FIG. 2B, and a small difference takes place between the bit lines 2a and 2b. When the activation signal lines SAP and SANB are driven toward the positive voltage level SAP and the ground voltage level SANB, respectively, then the sense amplifier circuit 4 is activated and increases the small difference in magnitude between the bit lines 2a and 2b together with the activation signals SAP and SANB. After the activation of the sense amplifier circuit 4, the precharging signal PIO goes up from the ground voltage level to the positive voltage level Vcc at time t3, and the input/output data signal lines 6a and 6b are blocked from the source of the precharging voltage level VCVT as shown in FIG. 2C. A read mode signal RM goes up to the positive high voltage level Vcc at time t4, and the n-channel type field effect transistors Q11 and Q12 turn on to couple the input/output data signal lines 6a and 6b with the source of positive voltage level. The control signal YSW goes up to the positive voltage level Vcc at time t5 and allows the n-channel type field effect transistors Q6 and Q7 to turn on to interconnects the bit lines 2a and 2b and the input/output data signal lines 6a and 6b. Since the small difference is sufficiently increased by time t5, the bit line 2a causes the input/output signal line 6a to maintain the precharging voltage level VCVT, but the bit line 2b at the ground voltage level lowers the input/output signal line 6b, because a ratio circuit takes place with the field effect transistors Q12, Q7 and Q5. Thus, the difference in voltage level between the bit lines 2a and 2b is transferred to the input/output data signal lines 6a and 6b, and the data amplifier circuit 8 produces an output data signal in response to the difference between the input/output data signal lines 6a and 6b. The n-channel type field effect transistor Q12 supplies current through the column selector circuit 5 to the bit line 2b, and the voltage level on the bit line 2b is lifted up at time t6.

The column address is, then, changed to another value, and the control signal YSW allows another bit line pair to couple with the input/output data signal lines 6a and 6b. If a new data bit transferred to the data signal lines 6a and 6b is identical in logic level with the data bit read out from the memory cell 1a, the input/output data signal line 6a remains in the precharging voltage level VCVT by the aid of the pull-up circuit 7; however, a new data bit opposite in logic level to the data bit causes the input/output data signal line 6a to alternate in voltage level with the input/output data signal line 6b. The new data bit is also supplied from the data amplifier circuit 8 to an external device. The column address is, thus, sequentially changed, and a series of data bits are read out from the semiconductor memory device shown in FIG. 1. Since the voltage difference between the input/output data signal lines 6a and 6b is fixedly maintained at a small value, the input/output data signal lines 6a and 6b are promptly responsive to the increased small difference between a selected bit line pair.

However, a problem is encountered in the prior art semiconductor memory device in that a long time period is consumed for alternating the voltage levels between the input/output data signal lines 6a and 6b upon fluctuation at the source of positive voltage level Vcc. In detail, fluctuation in voltage level is assumed to take place at the source of positive voltage level Vcc from time t7 to time t8, the positive voltage level Vcc goes down to a slightly lower level Vcc2 as shown in FIG. 3. Since the n-channel type field effect transistor Q4 is turned off, no current path is provided for the input/output data signal line 6a, and the input/output data signal line 6a tends to maintain the positive voltage level Vcc. However, the ratio circuit constituted by the field effect transistors Q12, Q7 and Q5 lowers the voltage level on the input/output data signal line 6b, and the difference in voltage level between the input/output data signal lines 6a and 6b is increased from D1 to D2. In this situation, if the new data bit is opposite in logic level to the data bit read out from the memory cell 1a, a bit line pair with the new data bit consumes a prolonged time period for alternating the voltage levels between the input/output data signal lines 6a and 6b, because the bit line pair needs to swing the input/output data signal line 6b over the wide difference D2.

SUMMARY OF THE INVENTION

It is therefore an important object of the present invention to provide a semiconductor memory device which is equipped with a pair of data signal lines propagating a data bit at a high speed regardless of fluctuation in voltage level at a source of power voltage.

To accomplish these objects, the present invention proposes to coupled a small current path between a pair of data signal lines.

In accordance with the present invention, there is provided a semiconductor memory device comprising: a) a plurality of memory cells arranged in rows and columns and storing data bits, respectively; b) a plurality of bit line pairs respectively coupled to the columns of the memory cells and having first bit lines and second bit lines respectively paired with the first bit lines; c) a plurality of word lines respectively coupled to the rows of the memory cells and selectively activating the memory cells for producing small differences in voltage level on the plurality of bit line pairs, respectively; d) a plurality of sense amplifier circuits respectively coupled to the plurality of bit line pairs, each of the plurality of sense amplifier circuits providing a first current path between a first voltage source and one of the first and second bit lines and a second current path between a second voltage source and the other of the first and second voltage sources depending upon the small difference on the associated bit line pair; e) first and second data signal lines; f) a column selector circuit interconnecting the first and second data signal lines and the first and second bit lines of one of the plurality of bit line pairs; g) third and fourth current paths respectively coupled between the first voltage source and the first and second data signal lines and supplying supplementary currents to the first and second data signal paths, respectively, for allowing voltage levels on the first and second data signal lines to vary within a predetermined voltage range; and h) a fifth current path coupled between the first and second data signal lines and causing the voltage level on one of the first and second data signal lines to follow the voltage level on the other of the first and second data signal lines upon fluctuation in voltage level at the first voltage source.

BRIEF DESCRIPTION OF THE DRAWINGS

The features and advantages of a semiconductor memory device according to the present invention will be more clearly understood from the following description taken in conjunction with the accompanying drawings in which.

DESCRIPTION OF THE PREFERRED EMBODIMENTS

First Embodiment

Figure 4:
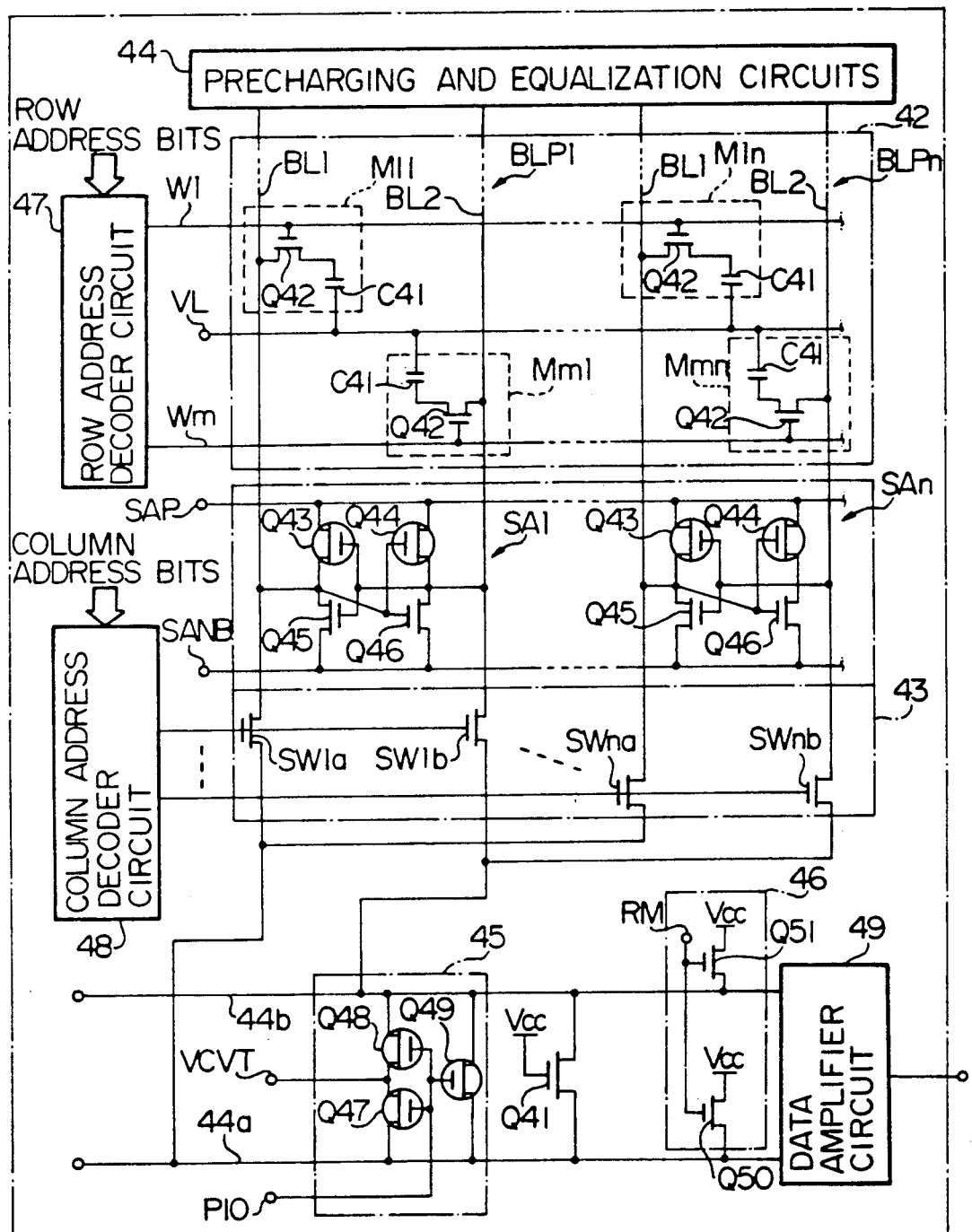
FIG. 4 is a circuit diagram showing the arrangement of a random access memory device embodying the present invention.

Referring first to FIG. 4 of the drawings, a random access memory device is fabricated on a semiconductor substrate 41 and comprises a memory cell array 42, a plurality of bit line pairs BLP1 to BLPn, a plurality of sense amplifier circuits SA1 to SAn, a column selector circuit 43, a pair of input/output data signal lines 44a and 44b, a precharging circuit combined with an equalization circuit 44 provided for the bit line pairs BLP1 to BLPn, another precharging circuit combined with another equalization circuit 45 associated with the input/output data signal lines 44a and 44b, a pull-up circuit 46 coupled between a source of positive voltage level Vcc and the input/output data signal lines 44a and 44b, a row address decoder circuit 47, a column address decoder circuit 48, a data amplifier circuit 49, and a small n-channel type field effect transistor Q41 coupled between the input/output data signal lines 44a and 44b. In this instance, the fifth current path is implemented by the n-channel type field effect transistor Q41 with a gate electrode coupled to the source of positive voltage level Vcc.

Although a large number of memory cells are incorporated in the memory cell array 42, only four memory cells M11, Mm1, M1n and Mmn are shown in FIG. 4 for the sake of simplicity. Each of the memory cells is of the one-transistor and one-capacitor type and, accordingly, implemented by a series combination of a switching transistor Q42 and a storage capacitor C41. The switching transistors Q42 are of the n-channel type. The bit line pairs BLP1 to BLPn are respectively coupled to the columns of the memory cells M11 to Mmn and have first bit lines BL1 respectively paired with second bit lines BL2. The switching transistors Q42 in each column are alternately coupled to the first and second bit lines BL1 and BL2 of the associated bit line pair, and the storage capacitors C1 are coupled to a voltage supply line VL. A plurality of word lines W1 to Wm are coupled to the gate electrodes of the switching transistors Q42 of the rows, respectively, and the row address decoder circuit 47 drives one of the word lines W1 to Wm to an active high voltage level on the basis of row address bits.

Each of the sense amplifier circuits SA1 to SAn comprises p-channel type field effect transistors Q43 and Q44 respectively coupled in series to n-channel type field effect transistors Q45 and Q46, and the two series combinations of the field effect transistors Q43 to Q46 are coupled in parallel between activation signal lines SAP and SANB. In this instance, either p-channel type field effect transistor Q43 or Q44 provides the first current path, and either n-channel type field effect transistor Q45 or Q46 forms the second current path. Since the activation signal lines SAP and SANB are respectively shifted to a positive voltage level Vcc and a ground voltage level, the first and second current paths couple the first and second bit lines BL1 and BL2 with a source of positive voltage level and a source of the ground voltage level.

The column selector circuit 43 comprises a plurality of switching transistors SW1a, SW1b, SWna and SWnb each formed by an n-channel type field effect transistor, and every two switching transistors SW1a and SW1b or SWna and SWnb are coupled at the gate electrodes thereof to one of the control lines extending in parallel from the column address decoder circuit 48. Every two switching transistors SW1a and SW1b or SWna and SWnb are associated with one of the bit line pairs BLP1 to BLPn and are coupled between the first and second bit lines BL1 and BL2 of the associated bit line pair and the input/output data signal lines 44a and 44b. The column address decoder circuit 48 drives one of the control lines to the positive voltage level Vcc, and, accordingly, the column selector circuit 43 interconnects one of the bit line pairs BLP1 to BLPn and the input/output data signal lines 44a and 44b.

The precharging circuit combined with the precharging circuit 45 comprises a series combination of p-channel type field effect transistors Q47 and Q48 coupled between a source of precharging voltage level VCVT and the input/output data signal lines 44a and 44b, and a p-channel type field effect transistor Q49. The precharging voltage level VCVT is slightly lower than the positive voltage level Vcc. A precharging signal PIO is supplied to the gate electrodes of the p-channel type field effect transistors Q47 to Q49 so that the input/output data signal lines 44a and 44b are precharged to and balanced at the precharging voltage level VCVT.

The pull-up circuit 46 is formed by two n-channel type field effect transistors Q50 and Q51 which are coupled in parallel between the source of positive voltage level Vcc and the input/output data signal lines 44a and 44b. The two n-channel type field effect transistors Q50 and Q51 provide the third and fourth current paths, respectively. A read mode signal RM is supplied to the gate electrodes of the n-channel type field effect transistors Q50 and Q51 so that the input/output data signal lines 44a and 44b alternately vary in voltage level within a predetermined voltage range. The precharging voltage level VCVT defines the upper voltage level of the predetermined voltage range, and the lower voltage level of the predetermined voltage range is determined by a ration circuit constituted by the n-channel type field effect transistors Q50 (or Q51), one of the switching transistors SW1a to SWnb and the n-channel type field effect transistor Q45 (or Q46). The n-channel type field effect transistor Q50 or Q51 allows a pull-up current or a supplementary current to flow therethrough, and the amount of the pull-up current is tens to hundreds times larger than the amount of current passing through the n-channel type field effect transistor Q41. In this instance, the n-channel type field effect transistors Q45, Q46 and SW1a to SWnb are as large in current driving capability as the n-channel type field effect transistors Q50 and Q51. However, the amount of the current flowing between the data signal lines 44a and 44b is much smaller than the pull-up current and, for this reason, hardly affects the read-out speed in a data read-out operation. Although the data read-out mode of operation is completed in tens nanosecond, fluctuation in voltage level at the source of voltage level Vcc continues at least several microsecond, and the small current path established in the n-channel type field effect transistor Q41 allows a data bit to be read out at a constant speed under fluctuation in voltage level.

Figure 1:
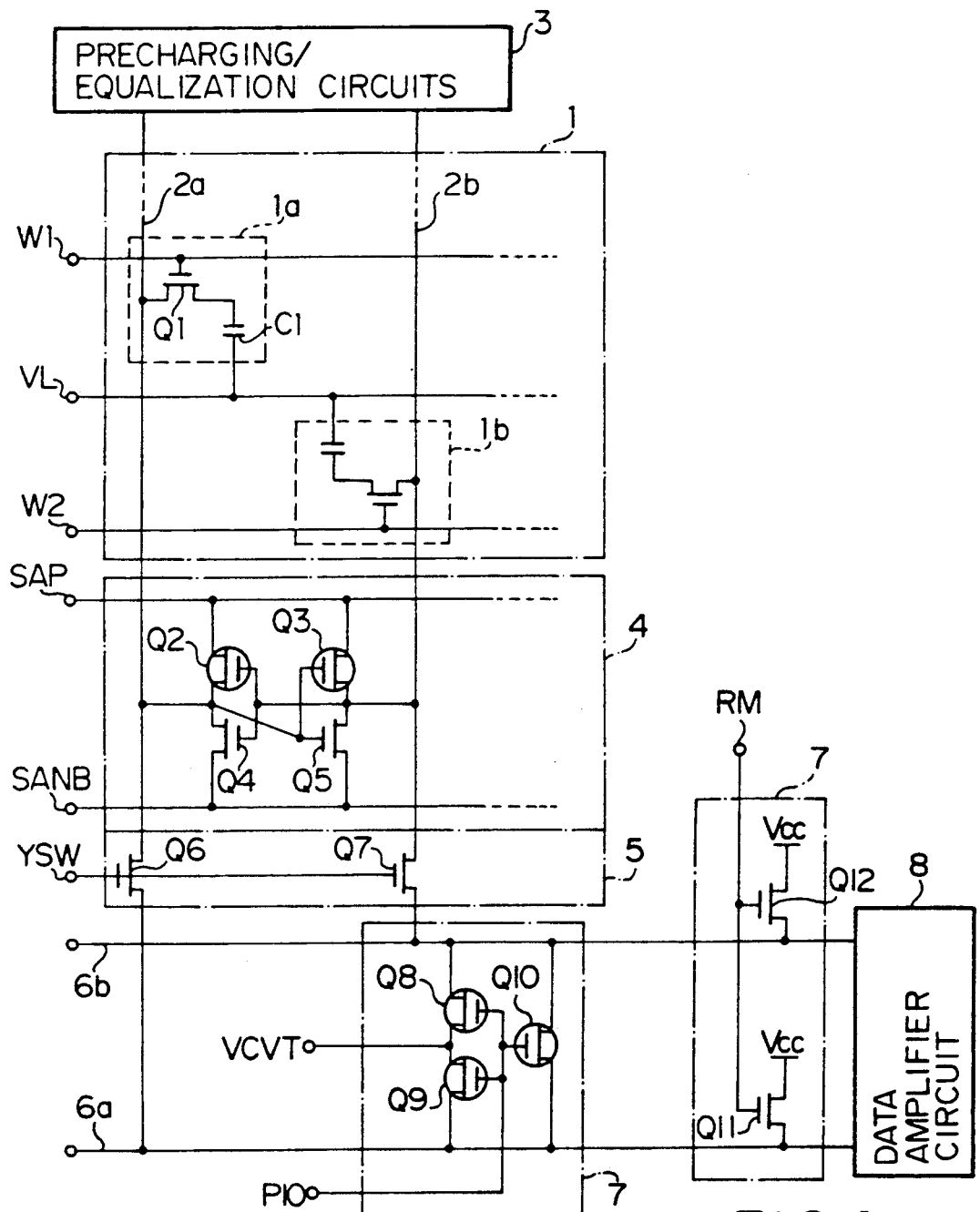
FIG. 1 is a circuit diagram showing the arrangement of the prior art semiconductor memory device.
Figure 2A:
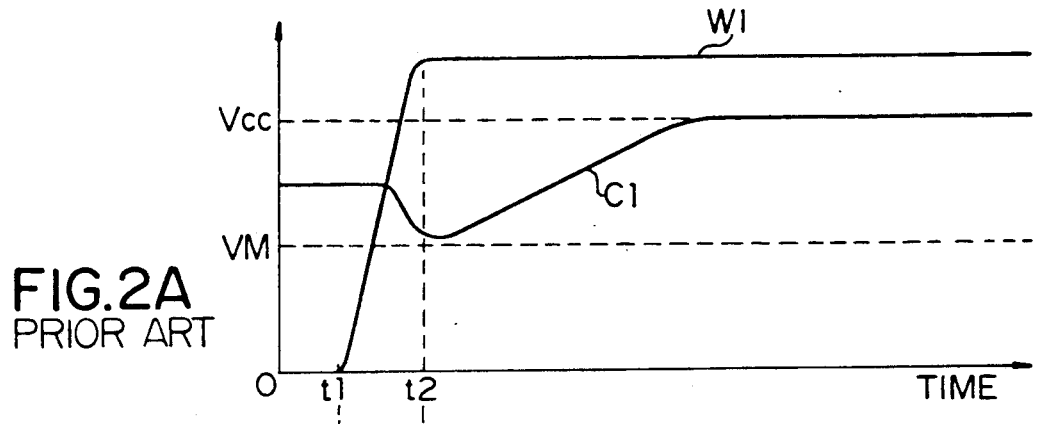
FIGS. 2A to 2C, are diagrams showing the waveforms of essential signals in the prior art semiconductor memory device.
Figure 2B:
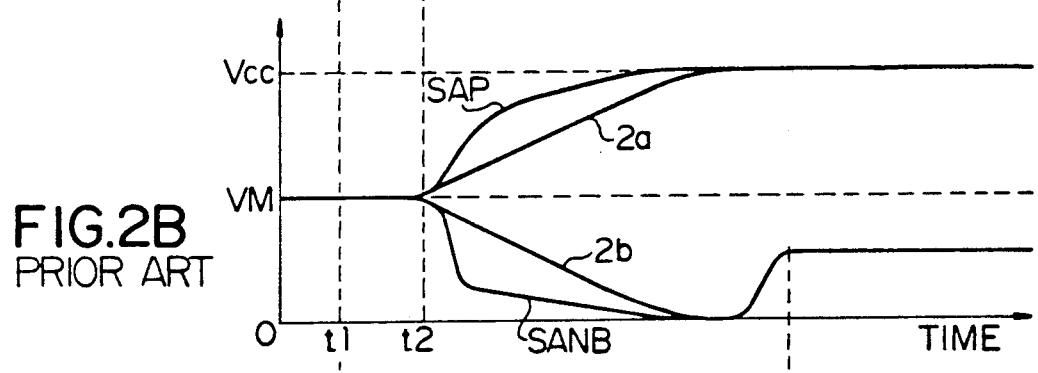
Figure 2C:
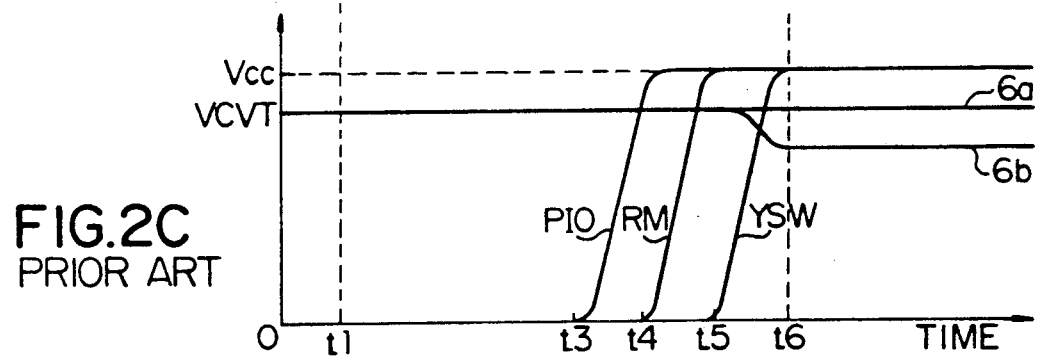
Figure 3:
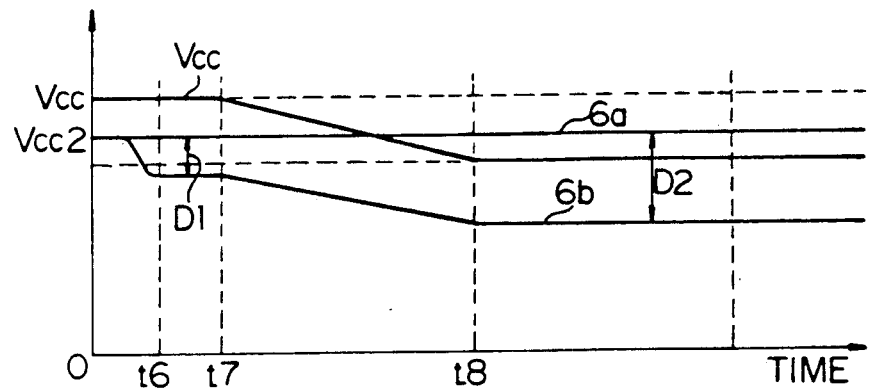
FIG. 3 is a diagram showing the voltage levels on the input/output data signal lines incorporated in the prior art semiconductor memory device upon fluctuation in voltage level of the power voltage source.

The random access memory device thus arranged selectively enters a data read-out mode of operation and a data write-in mode of operation. However, description is focused upon the data read-out mode of operation, because it would be easy to compare with the prior art semiconductor memory device. While no fluctuation in voltage level at the source of positive voltage level Vcc takes place, the random access memory device behaves as similar to the prior art semiconductor memory device shown in FIG. 1, and, therefore, description is omitted for avoiding repetition.

Figure 5:
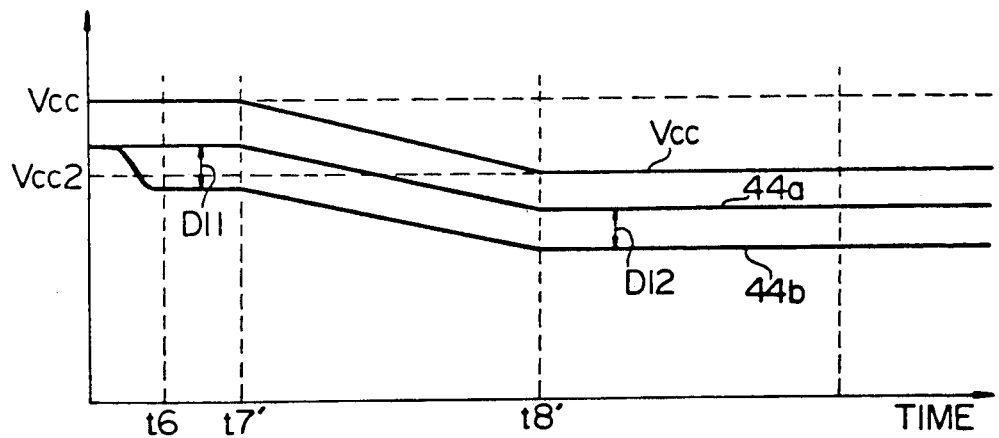
FIG. 5 is a diagram showing the voltage levels on the input/output data signal lines incorporated in the random access memory device upon fluctuation in voltage level of the power voltage source.

Assuming now that the row and column address bits designate the memory cell M11 storing a data bit of logic "1" level, the data bit of logic "1" level allows the input/output data signal line 44a to maintain in the upper voltage level of the predetermined voltage range, but the input/output data signal line 44b is decayed to the lower voltage level of the predetermined voltage range due to the second current path established in the n-channel type field effect transistor Q46 at time t6. If fluctuation in voltage level takes place in the source of the positive voltage level and, accordingly, the positive voltage level Vcc is slightly lowered toward Vcc2 level over a time period between time t7' and time t8', the voltage level on the input/output data signal line 44b follows the positive voltage level Vcc to Vcc2 as shown in FIG. 5, because the voltage level on the input/output data signal line 44b is determined by the ratio circuit constituted by the transistors Q51, SW1b and Q46.

Since the input/output data signal line 44a is conducted to the source of positive voltage level through the transistors SW1a and Q43, no current discharging path is coupled to the input/output data signal line 44a. However, the n-channel type field effect transistor Q41 is always turned on and allows the input/output data signal line 44a to follow the other input/output data signal line 44b. This results in that the voltage differences D11 and D12 are approximately equal to one another regardless of the fluctuation in voltage level. If the next column address bits designate other bit line pair with a data bit of logic "0" level, the column selector circuit 43 interconnects the other bit line pair and the input/output data signal lines 44a and 44b, and the other bit line pair alternates the voltage levels on the input/output data signal lines 44a and 44b with one another. However, the alternation in voltage level is achieved as quick as that under no fluctuation in voltage level, because the difference in voltage level D12 is as small as the difference D11.

As will be understood from the foregoing description, the n-channel type field effect transistor Q41 maintains the voltage difference between the input/output data signal lines 44a and 44b constant regardless of the fluctuation in voltage level, and, therefore, the random access memory device allows any external device to access a series of data bits at a constant speed under the fluctuation in voltage level at the source of positive voltage level Vcc.

Second Embodiment

Figure 6:
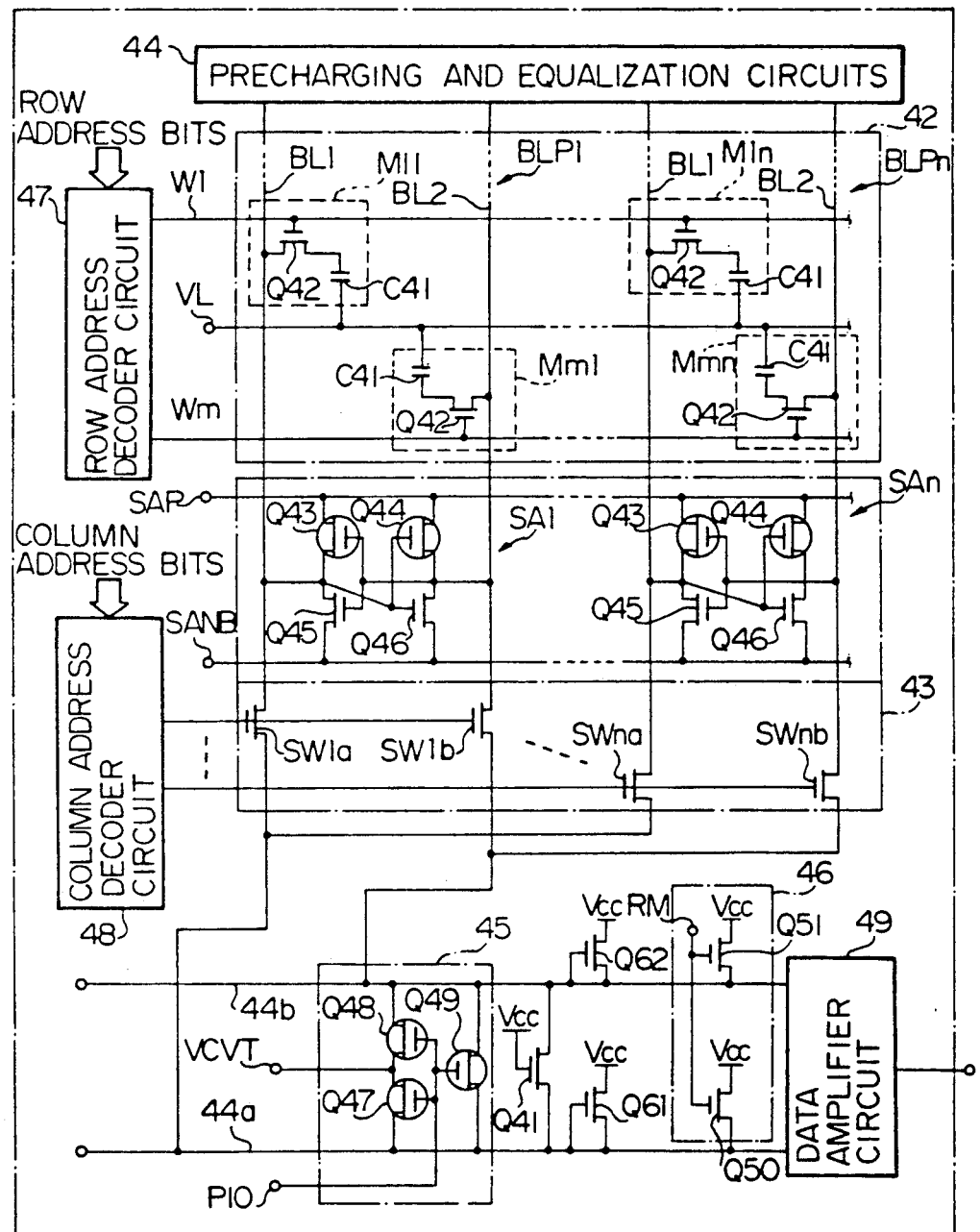
FIG. 6 is a circuit diagram showing the arrangement of another random access memory device embodying the present invention.

Turning to FIG. 6 of the drawings, another random access memory device embodying the present invention is illustrated. The random access memory device shown in FIG. 6 is similar in circuit arrangement to that shown in FIG. 4 except for two additional field effect transistors Q61 and Q62, and, for this reason, the other component circuits and transistors are designated by the same reference numerals and marks used in FIG. 4.

The two n-channel type field effect transistors Q61 and Q62 are coupled between the source of positive voltage level Vcc and the input/output data signal lines 44a and 44b, and the gate electrodes of the transistors Q61 and Q62 are coupled to the respective drain nodes thereof. The n-channel type field effect transistors Q61 and Q62 thus coupled serve as diodes and provide current paths from the input/output data signal lines 44a and 44b to the source of positive voltage level Vcc if the source of positive voltage is lower than the voltage levels on the input/output data signal lines 44a and 44b by a threshold voltage Vth of the transistors Q61 and Q62. The n-channel type field effect transistors Q61 and Q62 support the n-channel type field effect transistor Q41 upon violent voltage fluctuation exceeding the current driving capability of the transistor Q41, and, for this reason, the random access memory device shown in FIG. 6 is less affectable by fluctuation in voltage level rather than the random access memory device shown in FIG. 4.

Third Embodiment

Figure 7:
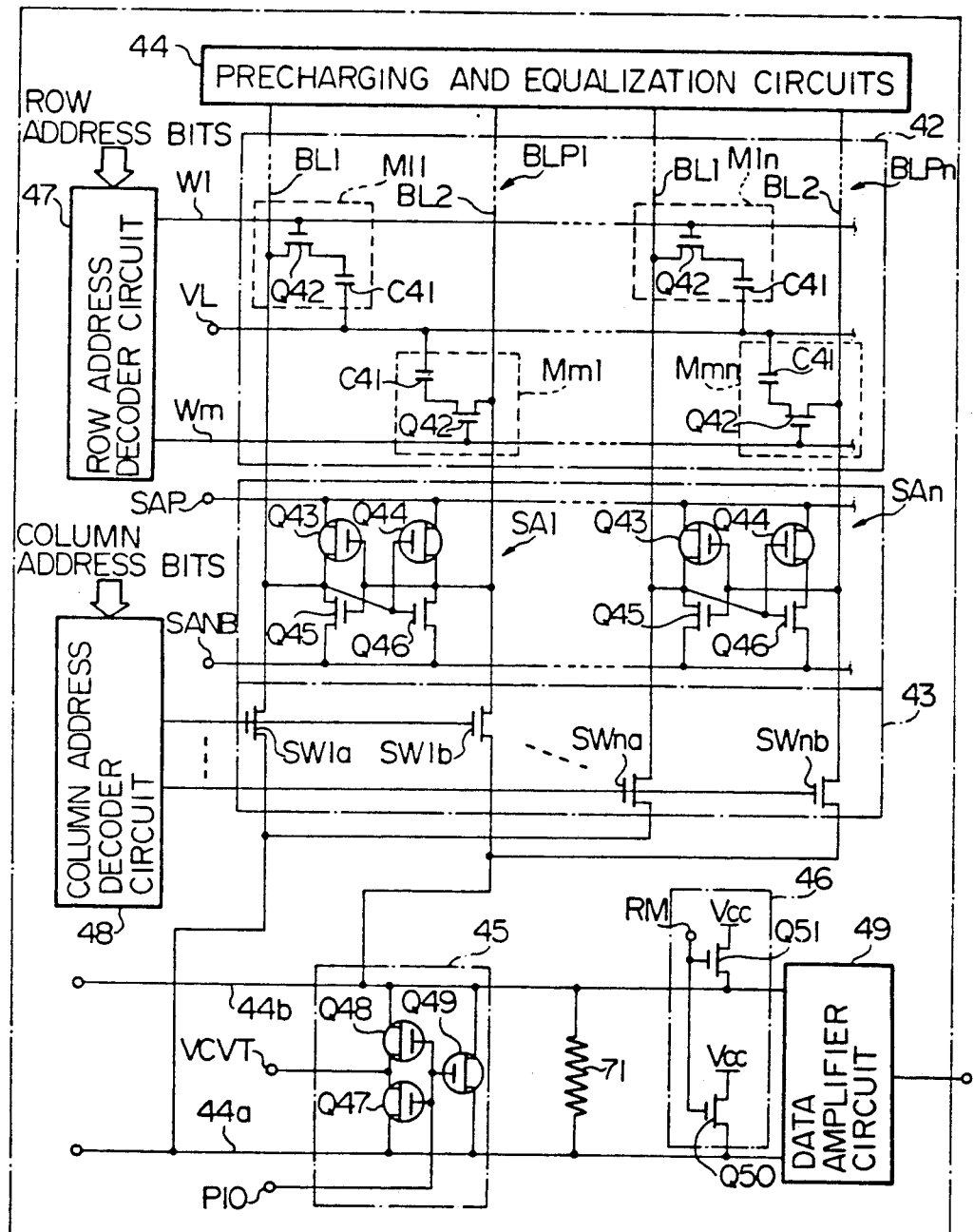
FIG. 7 is a circuit diagram showing the arrangement of still another random access memory device embodying the present invention.

Turning to FIG. 7, another random access memory device embodying the present invention is characterized by a resister element 71. The resister element 71 takes the position of the n-channel type field effect transistor Q41, but other component circuits and transistors are similar to those of the random access memory device shown in FIG. 4. For this reason, no further description is incorporated hereinbelow for the sake of simplicity.

Fourth Embodiment

Figure 8:
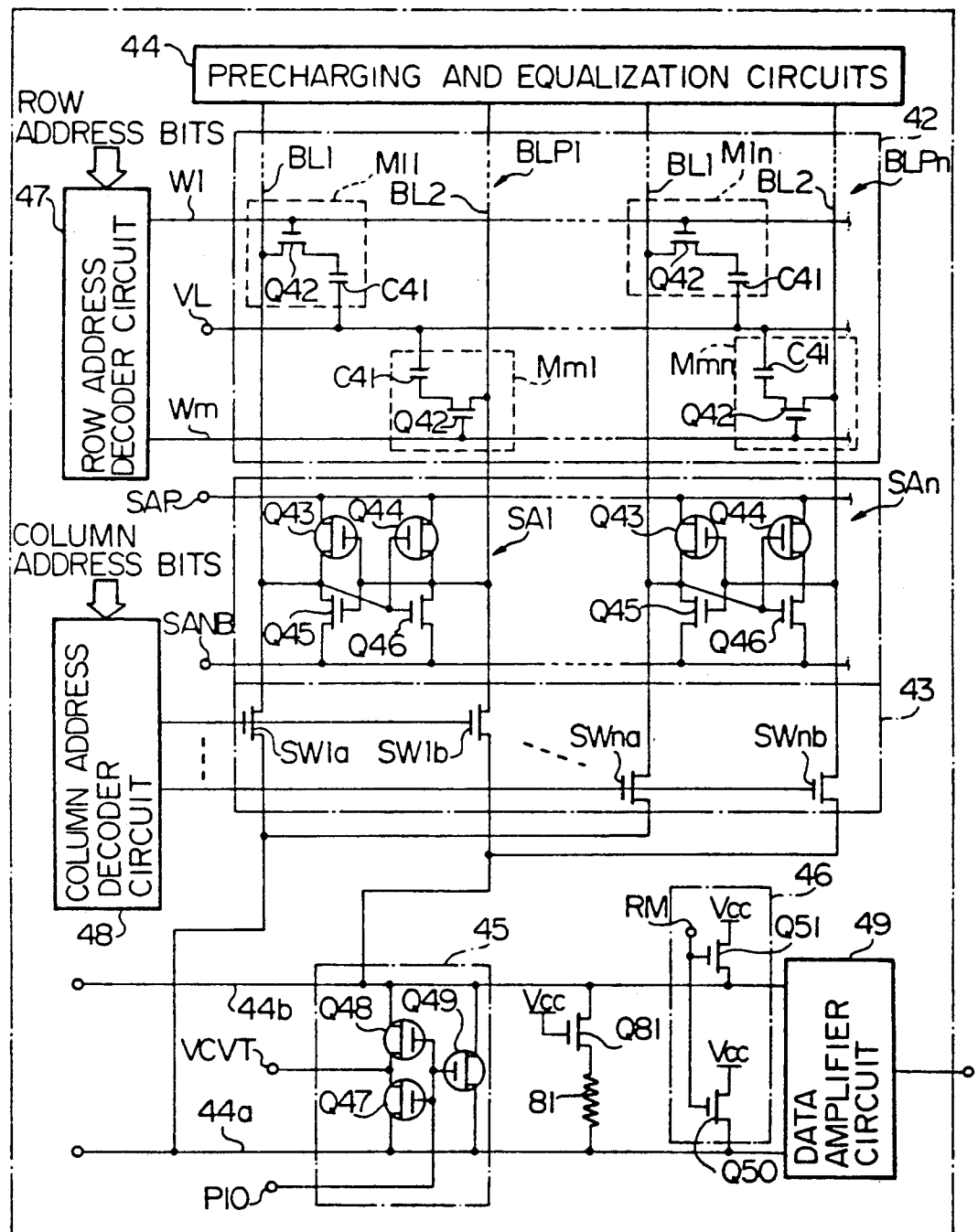
FIG. 8 is a circuit diagram showing the arrangement of still another random access memory device embodying the present invention.

FIG. 8 shows still another random access memory device embodying the present invention. The n-channel type field effect transistor Q41 is replaced with an n-channel type field effect transistor Q81 coupled in series with a resister element 81. In general, it is not easy to fabricate an extremely small sized transistor. However, if the resister element 81 restricts the current passing through the n-channel type field effect transistor Q81, fabrication of the n-channel type field effect transistor Q81 is relatively easy rather than the fabrication of the n-channel type field effect transistor Q41. This enhances the production yield of the random access memory device. In this instance, the fifth current path is established through the series combination of the n-channel type field effect transistor Q81 and the resister element 81 and the current passing through the fifth current path is as small as that of the n-channel type field effect transistor Q41.

Although particular embodiments of the present invention have been shown and described, it will be obvious to those skilled in the art that various changes and modifications may be made without departing from the spirit and scope of the present invention. For example, the memory cell may have another circuit configuration such as a static random access memory cell. Moreover, all of the preferred embodiments have the input/output data signal lines 44a and 44b; however, another implementation may have a pair of output data signal lines independent from a pair of input data signal lines.

What is claimed is:

1. A semiconductor memory device comprising:
   a) a plurality of memory cells arranged in rows and columns and storing data bits, respectively;
   b) a plurality of bit line pairs respectively coupled to said columns of said memory cells and having first bit lines and second bit lines respectively paired with said first bit lines;
   c) a plurality of word lines respectively coupled to said rows of said memory cells and selectively activating said memory cells for producing small differences in voltage level on said plurality of bit line pairs, respectively;
   d) a plurality of sense amplifier circuits respectively coupled to said plurality of bit line pairs, each of said plurality of sense amplifier circuits providing a first current path between a first voltage source and one of said first and second bit lines and a second current path between a second voltage source and the other of said first and second voltage sources depending upon said small difference on said associated bit line pair;
   e) first and second data signal lines;
   f) a column selector circuit interconnecting said first and second data signal lines and said first and second bit lines of one of said plurality of bit line pairs;
   g) third and fourth current paths respectively coupled between said first voltage source and said first and second data signal lines and supplying supplementary currents to said first and second data signal paths, respectively, for allowing voltage levels on said first and second data signal lines to vary within a predetermined voltage range; and p1 h) a fifth current path coupled between said first and second data signal lines and causing the voltage level on one of said first and second data signal lines to follow the voltage level on the other of said first and second data signal lines upon fluctuation in voltage level at said first voltage source.

2. A semiconductor memory device as set forth in claim 1, in which the amount of each of said pull-up current is at least tens times larger than the amount of current passing through said fifth current path.

3. A semiconductor memory device as set forth in claim 1, in which said fifth current path is established in a first field effect transistor of a first channel conductivity type.

4. A semiconductor memory device as set forth in claim 3, in which each of said sense amplifier circuits comprises a first series combination of a second field effect transistor of a second channel conductivity type and a third field effect transistor of said first channel conductivity type coupled between two activation signal lines coupled to or blocked from said first and second voltage sources, and a second series combination of a fourth field effect transistor of said second channel conductivity type and a fifth field effect transistor of said first channel conductivity type coupled between said two activation signal lines, a common drain node of said first series combination and gate electrodes of said fourth and fifth field effect transistors being coupled to said first bit line, a common drain node of said second series combination and gate electrodes of said second and third field effect transistors being coupled to said second bit line, and in which said first and second current paths are established in either second or fourth field effect transistor and either third or fifth field effect transistor.

5. A semiconductor memory device as set forth in claim 4, in which said third and fourth current paths are established in sixth and seventh field effect transistors of said first channel conductivity type.

6. A semiconductor memory device as set forth 5, in which said semiconductor memory device further comprises eighth and ninth field effect transistors of said first channel conductivity type coupled between said first voltage source and said first and second data signal lines, respectively, and having respective gate electrodes coupled to drain nodes thereof, thereby providing sixth and seventh current paths when said fluctuation in voltage level exceeds a predetermined level.

7. A semiconductor memory device as set forth in claim 6, in which said semiconductor memory device further comprises a precharging circuit combined with an equalization circuit coupled to said first and second data signal lines.

8. A semiconductor memory device as set forth in claim 1, in which said fifth current path is established in a resister element coupled between said first and second data signal lines.

9. A semiconductor memory device as set forth in claim 1, in which said fifth current path is established in a series combination of a field effect transistor of said first channel conductivity type and a resister element coupled between said first and second data signal lines.

* * * * *